United States Patent
Byeon et al.

(10) Patent No.: US 12,187,055 B2
(45) Date of Patent: Jan. 7, 2025

(54) SUBSTRATE TREATING APPARATUS, INKJET APPARATUS, AND MAINTENANCE METHOD

(71) Applicant: SEMES CO., LTD., Cheonan-si (KR)

(72) Inventors: Yae Jin Byeon, Daejeon (KR); Dong Yun Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 374 days.

(21) Appl. No.: 17/470,303

(22) Filed: Sep. 9, 2021

(65) Prior Publication Data
US 2022/0072884 A1 Mar. 10, 2022

(30) Foreign Application Priority Data

Sep. 10, 2020 (KR) .................. 10-2020-0116104

(51) Int. Cl.
| | | |
|---|---|---|
| *B41J 29/393* | (2006.01) | |
| *B05B 15/522* | (2018.01) | |
| *G02F 1/13* | (2006.01) | |
| *G06K 15/02* | (2006.01) | |
| *H10K 71/13* | (2023.01) | |

(52) U.S. Cl.
CPC .......... *B41J 29/393* (2013.01); *B05B 15/522* (2018.02); *G02F 1/1303* (2013.01); *G06K 15/027* (2013.01); *H10K 71/135* (2023.02)

(58) Field of Classification Search
USPC ....... 118/313, 315, 712, 713, 686, 663, 695, 118/696, 302, 305; 347/29–33
See application file for complete search history.

(56) References Cited

U.S. PATENT DOCUMENTS

| | | | | |
|---|---|---|---|---|
| 7,455,384 | B2 * | 11/2008 | Tezuka | B41J 2/165 347/29 |
| 2003/0063154 | A1 * | 4/2003 | Goto | B41J 2/145 347/40 |
| 2005/0002005 | A1 * | 1/2005 | Terada | G03F 7/70383 355/75 |
| 2019/0043745 | A1 * | 2/2019 | Zhang | H01L 21/67288 |

FOREIGN PATENT DOCUMENTS

| | | | | |
|---|---|---|---|---|
| CN | 105900418 A | * | 8/2016 | .......... G06T 7/0004 |
| JP | 2017161269 A | * | 9/2017 | |
| JP | 2018143976 | | 9/2018 | |
| KR | 1020040025678 | | 3/2004 | |
| KR | 10-2013-0066778 | | 6/2013 | |
| KR | 10-2017-0027000 | | 3/2017 | |
| KR | 10-2134273 | | 7/2020 | |
| WO | WO-2007132726 A1 | * | 11/2007 | ............ B41J 2/2142 |

OTHER PUBLICATIONS

English Translation WO2007132726A1 (Year: 2007).*
English Translation CN105900418A (Year: 2016).*
English Translation JP-2017161269-A (Year: 2017).*
Office Action from the Korean Intellectual Property Office dated Jun. 14, 2023.

* cited by examiner

*Primary Examiner* — Yewebdar T Tadesse

(57) ABSTRACT

Disclosed is a substrate treating apparatus. The inventive concept includes a support unit having a plate that supports a calibration board, on which a plurality of alignment marks are displayed, a first vision unit configured such that a relative location with respect to the plate is changeable, and that photographs the calibration board, and a second vision unit that photographs the calibration board in a scheme that is different from that of the first vision unit.

19 Claims, 6 Drawing Sheets

SUBSTRATE TREATING APPARATUS, INKJET APPARATUS, AND MAINTENANCE METHOD

CROSS-REFERENCE TO RELATED APPLICATIONS

A claim for priority under 35 U.S.C. § 119 is made to Korean Patent Application No. 10-2020-0116104 filed on Sep. 10, 2020, in the Korean Intellectual Property Office, the entire contents of which are hereby incorporated by reference.

BACKGROUND

Embodiments of the inventive concept described herein relate to a substrate treating apparatus, an inkjet apparatus, and a maintenance method, and more particularly, to a substrate treating apparatus that performs a printing process by discharging ink onto a substrate by using an inkjet head, an inkjet apparatus, and a method for maintaining the same.

In recent years, display elements such as liquid crystal display elements and organic EL display elements have required high resolutions. In order to manufacture the display elements having the high resolutions, more pixels have to be formed per unit area on a substrate, and it is important to precisely discharge a treatment liquid such as ink to the pixels disposed densely in this way. Otherwise, a display element having a defect may be determined to be defective. Accordingly, according to the related technologies, it is necessary to precisely manage a discharge point (for example, a striking point) of a chemical discharged to the pixels.

Korean Patent No. 2134273 discloses an inkjet printing system for manufacturing such a display element. According to the patent, in order to precisely calibrate a discharge location of a chemical, it is configured such that the discharge location of the chemical, that is, a striking point may be identified by a second vision unit in a maintenance area.

According to the patent, the second vision unit identifies the striking point by photographing an area, to which a chemical is discharged. However, when the area, to which the chemical is discharged, becomes wider, the second vision unit divides and photographs the area, to which the chemical is discharged, to acquire a plurality of images, and a user has to combine the plurality of images to identify a striking point. This is because a range, in which the second vision unit performs photographing, is restrictive. Furthermore, when the area, to which the chemical is discharged, is divided and photographed, an image may be distorted in a process of combining the plurality of images.

Further, according to the patent, a discharge location of the chemical is calibrated by using a second substrate, on which a second alignment mark is present. However, even when the discharge location of the chemical of the inkjet head is calibrated, an error may occur in the calibrated discharge location of the chemical of the inkjet head when a movement axis of the second substrate is not precisely aligned.

PRIOR TECHNICAL DOCUMENTS

Patent Documents

Korean Patent No. 10-2134273

SUMMARY

Embodiments of the inventive concept provide a substrate treating apparatus that may efficiently treat a substrate, an inkjet apparatus, and a maintenance method.

Embodiments of the inventive concept provide a substrate treating apparatus that may precisely calibrate a discharge location (that is, a striking point) of a chemical of an inkjet head, an inkjet apparatus, and a maintenance method.

Embodiments of the inventive concept provide a substrate treating apparatus that may calibrate an image captured by a vision unit maximally similarly to an actual image, an inkjet apparatus, and a maintenance method.

The aspect of the inventive concept is not limited thereto, and other unmentioned aspects of the present invention may be clearly appreciated by those skilled in the art from the following descriptions.

The inventive concept provides a substrate treating apparatus. The inventive concept includes a support unit having a plate that supports a calibration board, on which a plurality of alignment marks are displayed, a first vision unit configured such that a relative location with respect to the plate is changeable, and that photographs the calibration board, and a second vision unit that photographs the calibration board in a scheme that is different from that of the first vision unit.

According to an embodiment, the substrate treating apparatus may further include a controller, and the controller may control the first vision unit and the support unit such that the calibration board is photographed while the relative location of the first vision unit with respect to the plate is changed.

According to an embodiment, the controller may control the first vision unit and the support unit such that the relative location of the first vision unit with respect to the plate is changed by an interval between, among the alignment marks, adjacent alignment marks.

According to an embodiment, movement axes of the plate and/or the first vision unit may be aligned based on a location of the alignment mark that is moved according to a change in the relative location of the first vision unit with respect to the plate, and the controller may control the second vision unit to photograph the calibration board so as to acquire an image of the calibration board.

According to an embodiment, the controller may compare an interval between the alignment marks included in the image and an actual interval between the alignment marks displayed on the calibration board.

According to an embodiment, the controller may calculate a signal calibration value for the second vision unit by comparing the interval on the image and the actual interval.

According to an embodiment, the first vision unit may be an area camera that photographs the calibration board in real time, and the second vision unit may be a line scan camera that photographs the calibration board in a line scan scheme.

According to an embodiment, the substrate treating apparatus may further include a process executing unit that causes a head to supply a chemical to a substrate and treat the substrate, a maintenance unit that maintains the head and having the support unit, and a liquid discharge unit having the head, and a gantry that supports the head such that the head is moved between the process executing unit and the maintenance unit.

According to an embodiment, when viewed from a top, the process executing unit and the maintenance unit may be disposed along a second direction, and the support unit may be configured such that the plate is moved along the second direction and a first direction that is perpendicular to the second direction when the plate is viewed from the top.

The inventive concept provides an inkjet printing apparatus. The inkjet printing apparatus includes a support unit having a plate that supports a calibration board, on which a plurality of alignment marks that are spaced apart from each other by a preset interval are displayed, a first vision unit configured such that a relative location with respect to the plate is changeable, and that photographs the calibration board in real time, and a second vision unit that photographs the calibration board in a line scan scheme.

According to an embodiment, the inkjet printing apparatus may further include a controller, and the controller controls the first vision unit and the support unit such that the calibration board is photographed while the relative location of the first vision unit with respect to the plate is changed by the preset interval.

According to an embodiment, after movement axes of the plate and/or the first vision unit are aligned based on a location of the alignment mark that is moved according to a change in the relative location of the first vision unit with respect to the plate, the controller may control the second vision unit to photograph the calibration board so as to acquire an image of the calibration board.

According to an embodiment, the controller may compare an interval of the alignment marks included in the image and an actual interval of the alignment marks displayed on the calibration board, and may calculate a signal calibration value for the second vision unit.

According to an embodiment, the first vision may be mounted on an inkjet head that discharges ink to a substrate and is movable together with the inkjet head.

According to an embodiment, the inkjet printing apparatus may further include a gantry that supports the inkjet head.

According to an embodiment, the inkjet printing apparatus may further include a process executing unit that performs a printing process by causing the inkjet head to discharge the ink to the substrate, and a maintenance unit that maintains the inkjet head and having the support unit, the gantry may cause the inkjet head to be moved between the process executing unit and the maintenance unit.

The inventive concept provides an inkjet printing apparatus. The inkjet printing apparatus includes a process executing unit that performs a printing process by causing an inkjet head to discharge ink to a substrate, a maintenance unit that maintains the inkjet head and having a support unit that supports a calibration board, on which a plurality of alignment marks are displayed while being spaced apart from each other by a preset interval, a liquid discharge unit having the inkjet head, and a gantry configured such that the inkjet head is moved between the process executing unit and the maintenance unit, a first vision unit that photographs the calibration board, and being an area camera, and a second vision unit that photographs the calibration board, and being a line scan camera.

According to an embodiment, the inkjet printing apparatus may further include a controller, and the controller may control the first vision unit and the support unit such that the calibration board is photographed in real time while a relative location of the first vision unit with respect to a plate included in the support unit and that supports the calibration board is changed.

According to an embodiment, after movement axes of the plate and/or the first vision unit are aligned based on a location of the alignment mark that is moved according to a change in the relative location of the first vision unit with respect to the plate, the controller may control the second vision unit to photograph the calibration board.

According to an embodiment, the controller may compare an interval of the alignment marks included in an image and an actual interval of the alignment marks of the calibration board, and may calculate a signal calibration value for the second vision unit such that the interval and the actual interval coincide with each other.

The inventive concept provides a method for maintaining an inkjet printing apparatus that performs a printing process by discharging ink to a substrate. The method includes seating a calibration board, on which a plurality of alignment marks are spaced apart from each other by a preset interval, on a plate, and photographing the calibration board by using an area camera while moving the calibration board by the preset interval, aligning movement axis of the plate or the area camera based on change in the locations of the alignment marks identified by using the area camera, and thereafter, acquiring an image of the calibration board by using a line scan camera.

According to an embodiment, a controller may compare an interval of the alignment marks included in the acquired image and an actual interval of the alignment marks displayed in the calibration board.

According to an embodiment, the controller may calculate and store a signal calibration value for controlling the line scan camera such that the interval on the image and the actual interval coincide with each other.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the elements may be exaggerated for clearer description.

The terms such as first and second may be used to describe various elements, but the elements are not limited to the terms. The terms may be used only for the purpose of distinguishing one element from another element. For example, while not deviating from the scope of the inventive concept, a first element may be named a second element, and similarly, the second element may be named the first element.

When it is mentioned that one element is "connected to" or "electrically connected to" another element, it should be understood that the first element may be directly connected or electrically connected to the second element but a third element may be provided therebetweeen. On the other hand, when it is mentioned that an element is "directly connected to" or "directly electrically connected to" another element, it should be understood that a third element is not present between them. It should be construed that other expressions that describe the relationships between elements, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the inventive concept pertains. The terms defined in the generally used dictionaries should be construed as having the meanings that coincide with the meanings of the contexts of the related technologies, and should not be construed as ideal or excessively formal meanings unless clearly defined in the specification of the present disclosure.

Hereinafter, embodiments of the inventive concept will be described with reference to FIGS. 1 to 9.

Figure 1:
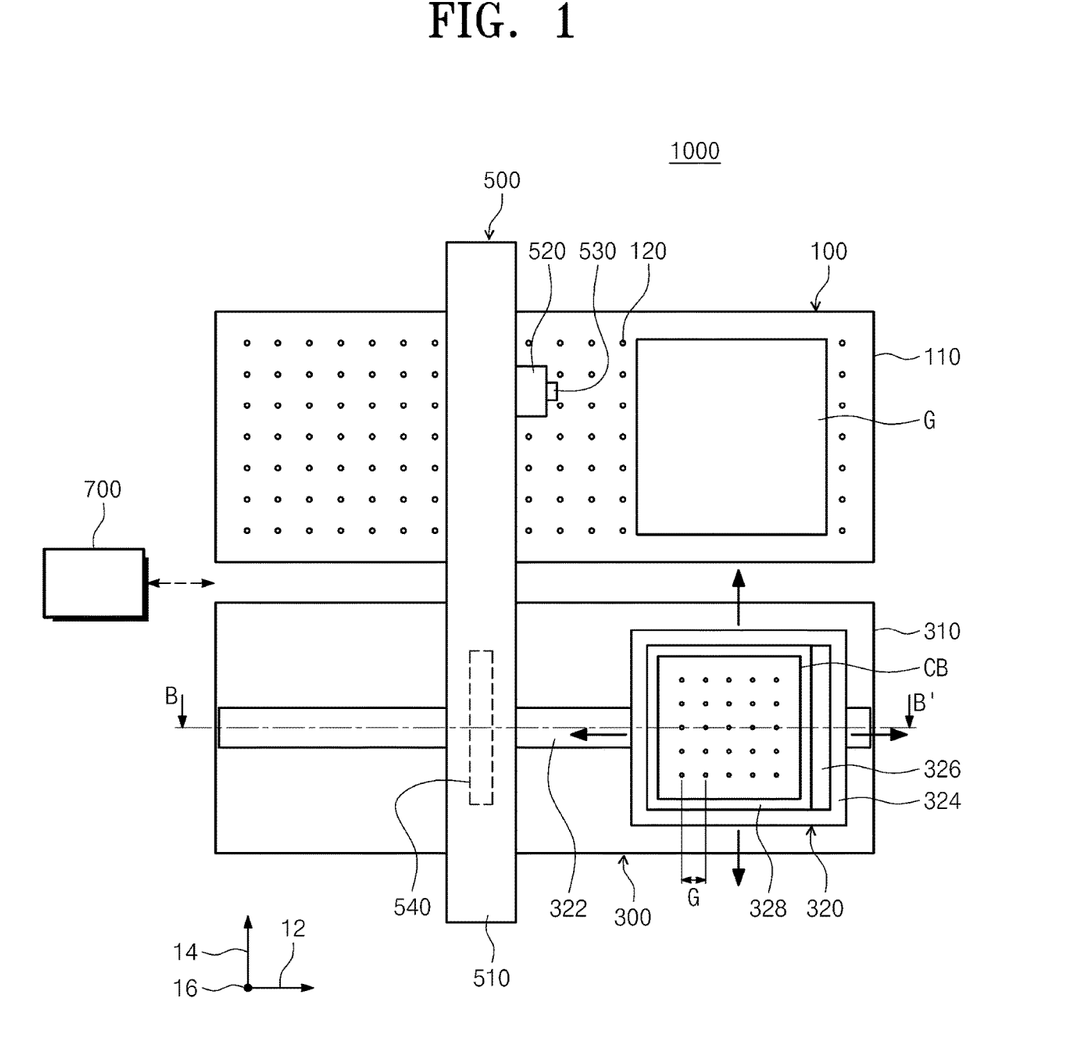
FIG. 1 is a view illustrating a substrate treating apparatus according to an embodiment of the inventive concept.
Figure 2:
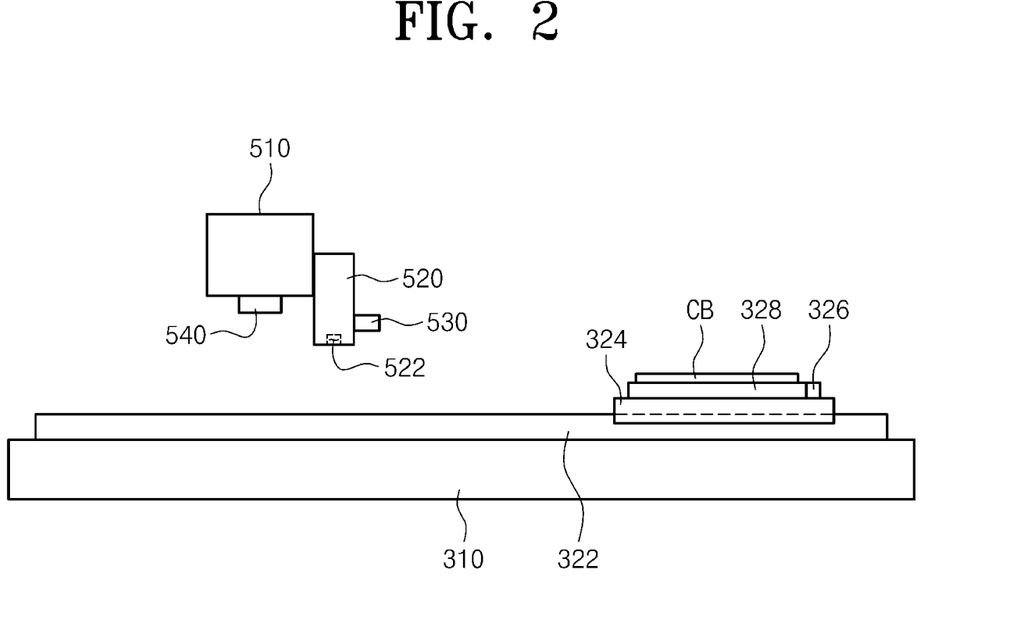
FIG. 2 is a view of the substrate treating apparatus of FIG. 1, taken along line B-B' of FIG. 1.

FIG. 1 is a view illustrating a substrate treating apparatus according to an embodiment of the inventive concept. FIG. 2 is a view of the substrate treating apparatus of FIG. 1, taken along line B-B' of FIG. 1. A substrate treating apparatus 1000 according to an embodiment of the inventive concept may be an inkjet apparatus that treats a substrate "G" by discharging a chemical such as ink onto the substrate "G". Furthermore, the substrate "G" may be a glass substrate. The substrate treating apparatus 1000 may include a process executing unit 100, a maintenance unit 300, a liquid discharge unit 500, and a controller 700. The process executing unit 100 and the maintenance unit 300 may be disposed along a second direction 14 when viewed from the top. Hereinafter, a direction that is perpendicular to the second direction 14 when viewed from the top will be referred to as a first direction 12, and a direction that is perpendicular to the first direction 12 and the second direction 14 will be referred to as a third direction 16. The third direction 16 may refer to a direction that is perpendicular to a ground surface.

The process executing unit 100 may be a part that treats the substrate "G" by discharging a chemical onto the substrate "G". The process executing unit 100 may be a part that treats the substrate "G" by causing an inkjet head 520, which will be described below, to discharge a chemical such as ink. The process executing unit 100 may be a part that treats the substrate "G" by causing an inkjet head 520, which will be described below, to discharge a chemical such as ink. The process executing unit 100 may include a process stage 110. A plurality of air holes 120 may be formed in the process stage 110. The plurality of air holes 120 may allow the substrate "G" to float by ejecting air in the third direction 16. Furthermore, the process executing unit 100 may further include a gripper (not illustrated) that slides along a guide rail while gripping one side or opposite sides of the floated substrate "G".

The maintenance unit 300 may maintain the inkjet head 520, which will be described below. For example, the maintenance unit 300 may calibrate a discharge location (that is, a striking point) of the chemical discharged by the inkjet head 520. For example, the substrate "G" is positioned on a support unit 320, which will be described below, the chemical is discharged onto the substrate "G" while the substrate "G" is moved, and the striking point of the chemical discharged by the inkjet head 520 may be calibrated based on the discharge location of the chemical discharged onto the substrate "G". Furthermore, the maintenance unit 300 may identify, among the plurality of nozzles of the inkjet head 520, a nozzle, from which the chemical has not been discharged appropriately, and may maintain (for example, clean) the corresponding nozzle.

The maintenance unit 300 may include a maintenance stage 310 and the support unit 320. Furthermore, the support unit 320 may include a first transfer rail 322, a first plate 324, a second transfer rail 326, and a second plate 328. Furthermore, the support unit 320 may support the substrate "G" or a calibration board CB. Furthermore, the support unit 320 may change a location of the supported substrate "G" or the calibration board CB along the first direction 12 and/or the second direction 14.

The first transfer rail 322 may be installed on the maintenance stage 310. The first transfer rail 322 may be an LM guide. A lengthwise direction of the first transfer rail 322 may be parallel to a direction, in which the substrate "G" is transferred in the process executing unit 100. For example, the lengthwise direction of the first transfer rail 322 may be the first direction 12. The first plate 324 may be installed on the first transfer rail 322. The first plate 324 may be moved along the first direction 12 that is the lengthwise direction of the first transfer rail 322.

Furthermore, the second transfer rail 326 may be installed on the first plate 324. The second transfer rail 326 may be an LM guide. A lengthwise direction of the second transfer rail 326 may be perpendicular to the lengthwise direction of the first transfer rail 322 when viewed from the top. For example, the lengthwise direction of the second transfer rail 326 may be the second direction 14.

Furthermore, the second plate 328 may be coupled to the second transfer rail 326. For example, one side of the second plate 328 may be coupled to the second transfer rail 326. The second plate 328 may be moved along the second direction 14 that is the lengthwise direction of the second transfer rail 326.

Furthermore, the second plate 328 may support the substrate "G" or the calibration board CB. For example, an upper surface of the second plate 328 may a seating surface, on which the substrate "G" or the calibration board CB is positioned. Accordingly, a location of the substrate "G" or the calibration board CB supported by the support unit 320 may be changed along the first direction 12 as the first plate 324 is moved. Furthermore, a location of the substrate "G" or the calibration board CB supported by the support unit 320 may be changed along the second direction 14 as the second plate 328 is moved.

The liquid discharge unit 500 may treat the substrate "G" by discharging a chemical such as ink. The liquid discharge unit 500 may include a gantry 510, the inkjet head 520, a first vision unit 530, and a second vision unit 540.

The gantry 510 may be configured such that the inkjet head 520 is driven to reciprocate linearly. For example, the gantry 510 may support the inkjet head 520 such that the inkjet head 520 may be moved between the process executing unit 100 and the maintenance unit 300. For example, a lengthwise direction of the gantry 510 may be the second direction 14 when viewed from the top. Accordingly, the inkjet head 520 that is supported by the gantry 510 may be moved along the second direction 14. Furthermore, the gantry 510 may be installed such that a location thereof is fixed.

The inkjet head 520 may be configured such that a plurality of nozzles 522 for discharging the chemical are disposed. The plurality of nozzles 522 disposed in the inkjet head 520 may be disposed at an interval of a specific pitch. The nozzles may have piezoelectric elements corresponding to the number of the nozzles, and the chemical may be disposed onto the substrate through the nozzles, through operations of the piezoelectric elements. That is, through the operations of the piezoelectric elements provided in the nozzles, the chemical may be discharged onto the substrate through the nozzles. In particular, the chemical discharged from the nozzles may be independently adjusted through control of voltages applied to the piezoelectric elements.

Furthermore, the inkjet head 520 may be moved to an upper side of the process stage 110 when a printing process is performed on the substrate "G", and may discharge the chemical onto the substrate "G" while reciprocating along the second direction 14. Furthermore, the inkjet head 520 may be moved to an upper side of a process stage 110 when a printing process is performed on the substrate "G", and may discharge the chemical onto the substrate "G" while reciprocating along the second direction 14. Accordingly, the striking point of the chemical discharged by the inkjet head 520, or may identify, among the nozzles 522 of the inkjet head 520, which nozzle has not appropriately discharged the chemical.

The first vision unit 530 may be an area camera. The first vision unit 530 may photograph the substrate "G" and/or the calibration board CB in real time. The first vision unit 530 may acquire an image for the substrate "G" and/or the calibration board CB, or may acquire an image for the substrate "G" and/or the calibration board CB that is moving. The first vision unit 530 may be mounted on the inkjet head 520. Accordingly, the first vision unit 530 may be moved together with the inkjet head 520. For example, when the inkjet head 520 is moved to an upper side of the process stage 110, the first vision unit 530 also may be moved to the upper side of the process stage 110 together with the inkjet head 520. Unlike this, when the inkjet head 520 is moved to an upper side of the maintenance stage 310, the first vision unit 530 also may be moved to the upper side of the maintenance stage 310. However, the inventive concept is not limited thereto, and the first vision unit 530 may be installed in the gantry 510 such that a location thereof is fixed.

Furthermore, as described above, a relative location of the first vision unit 530 with respect to the second plate 328 of the support unit 320 may be changed. For example, the relative location of the first vision unit 530 with respect to the second plate 328 along the first direction 12 may be changed.

The second vision unit 540 may acquire an image by photographing the substrate "G" and/or the calibration board CB in a scheme that is different from that of the first vision unit 530. For example, the second vision unit 540 may be a line scan camera. The second vision unit 540 may be installed on a lower surface of the gantry 510. The second vision unit 540 may be disposed to overlap the maintenance stage 310 when viewed from the top. Accordingly, the second vision unit 540 may acquire an image by photographing the substrate "G" or the calibration board CB supported by the support unit 320.

A length of the second vision unit 540 may be larger than or the same as a width of the substrate "G" or the calibration board CB when viewed from the top. Accordingly, when the substrate "G" or the calibration board CB that is moved while being supported by the support unit 320 passes through an area photographed by the second vision unit 540, the second vision unit 540 may acquire the image of the substrate "G" or the calibration board CB.

In the above-described example, it has been described as an example that the length of the second vision unit 540 is larger than or the same as the width of the substrate "G" or the calibration board CB, but the inventive concept is not limited thereto. For example, the length of the second vision unit 540 may be smaller than the width of the substrate "G" or the calibration board CB, and in this case, the second vision unit 540 may photograph the substrate "G" or the calibration board CB while reciprocating along the second direction 14.

The controller 700 may control the substrate treating apparatus 1000. For example, the controller 700 may control the substrate treating apparatus 1000 such that the substrate treating apparatus 1000 performs a printing process on the substrate "G". Furthermore, the controller 700 may control the substrate treating apparatus 1000 such that the substrate treating apparatus 1000 performs a maintenance method, which will be described below. For example, the controller 700 may control the liquid discharge unit 500 and the support unit 320 to perform the maintenance method, which will be described below. Furthermore, the controller 700 may control the first vision unit 530 and the second vision unit 540 to perform the maintenance method, which will be described below. Furthermore, the controller 700 may include a process controller including a microprocessor (computer) that executes control of the substrate treating apparatus 1000, a keyboard for inputting commands to allow an operator to manage the substrate treating apparatus 1000, a user interface including a display that visualizes and displays an operation situation of the substrate treating apparatus 1000, and a memory unit for storing a control program for executing processing executed by the substrate treating apparatus 1000 under a control of the process controller, or a program for executing processing, that is, a processing recipe in elements according to various data and processing conditions. Furthermore, the user interface and the memory unit may be connected to the process controller. The processing recipe may be stored in a memory medium of the memory unit, and the memory medium may be a hard disk, and may be a transportable disk such as a CD-ROM, a DVD, or the like, a semiconductor memory such as a flash memory.

The calibration board CB may be used to align the movement axes of the plates 324 and 328 that are moved by the support unit 320. For example, the calibration board CB may be used to align the movement axis of the first plate 324. That is, the calibration board CB may be used to align an axis of the first transfer rail 322. One or more alignment marks "M" may be displayed on an upper surface of the calibration board CB. For example, the alignment marks "M" may be displayed on the upper surface of the calibration board CB while being spaced apart from each other by a preset interval "G". The alignment marks "M" may have a cylindrical shape having a diameter of 30 μm. The preset interval "G" of the alignment marks "M" may be 200 μm. The preset interval "G" of the alignment marks "M" may be a very small interval, but the interval and the diameter of the alignment marks "M" are illustrated in a rather exaggerated manner in the drawings for convenience of description.

Figure 3:
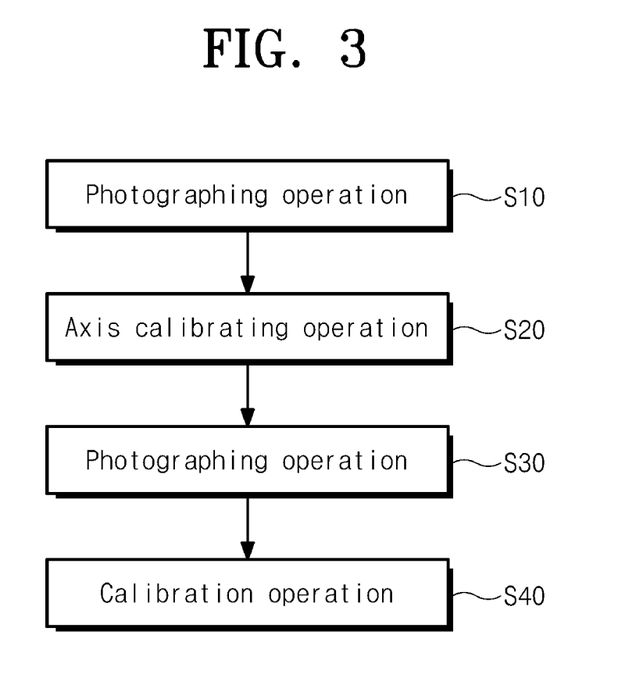
FIG. 3 is a flowchart illustrating a maintenance method according to an embodiment of the inventive concept.

FIG. 3 is a flowchart illustrating a maintenance method according to an embodiment of the inventive concept. The maintenance method according to the embodiment of the inventive concept may be a method for setting the maintenance unit 300 before the inkjet head 520 is maintained. For example, to maintain the inkjet head 520, the substrate "G" may be supported by the support unit 320 to be moved, the chemical such as ink may be discharged onto the substrate "G", the discharge location of the inkjet head 520 may be calibrated by using the striking point of the chemical discharged onto the substrate "G", and the nozzles 522 of the inkjet head 520 may be cleaned. The maintenance method according to the embodiment of the inventive concept may be a method for setting the maintenance unit 300 in advance such that the maintenance for the inkjet head 520 may be performed more precisely.

The maintenance method according to the embodiment of the inventive concept may include a photographing operation S10, an axis calibrating operation S20, a photographing operation S30, and a calibration operation S40.

In the photographing operation S10, the first vision unit 530 may be located on the maintenance stage 310. In the photographing operation S10, the calibration board CB may be seated on the second plate 328, the second plate 328 may be moved, and the relative location between the first vision unit 530 and the second plate 328 may be changed. Then, the second plate 328 may be repeatedly moved by an interval (for example, 200 μm) of the alignment marks "M". That is, the relative location of the second plate 328 and the first vision unit 530 may be changed by the interval "G" between, among the alignment marks "M", adjacent alignment marks "M".

Figure 4:
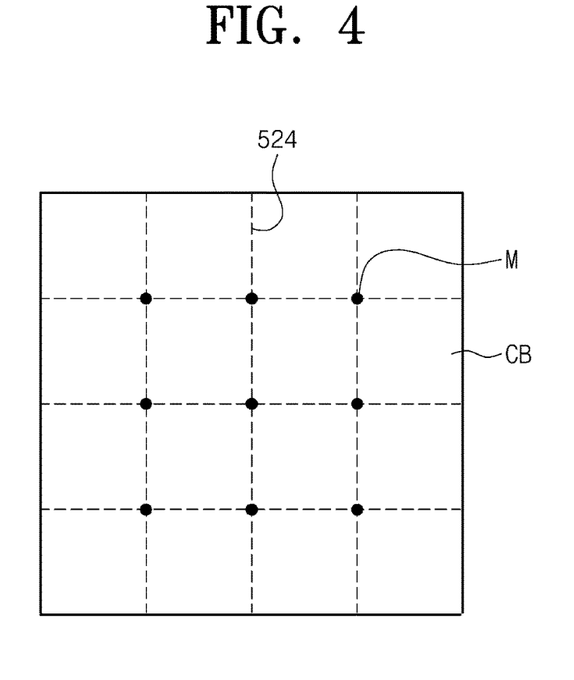
FIGS. 4 and 5 are views illustrating images acquired by photographing a calibration board by a first vision unit, in a photographing operation of FIG. 3.
Figure 5:
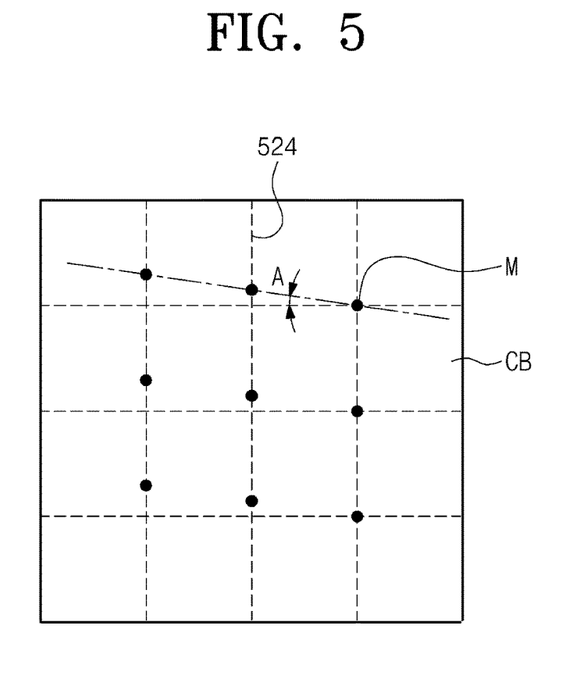

FIGS. 4 and 5 are views illustrating images obtained by photographing a calibration board by a first vision unit, in a photographing operation of FIG. 3. Referring to FIGS. 4 and 5, when the first vision unit 530 photographs the calibration board CB in real time, scales 524 of 3 by 3 may be expressed in the captured image. Because the second plate 328 is repeatedly moved by the interval of the alignment marks "M", the image captured by the first vision unit 530 may be maintained as the image of FIG. 4 when the movement axis of the calibration board CB is precise (for example, when the lengthwise direction of the first transfer rail 322 is precisely parallel to the first direction 12).

However, when the movement axis of the calibration board CB is not precise (for example, when the lengthwise direction of the first transfer rail 322 is not precisely parallel to the first direction 12), the image captured by the first vision unit 530 is changed from the image of FIG. 4 to the image of FIG. 5. When the movement axis of the calibration board CB is not precise, any one of an imaginary line that connects the alignment marks "M" and the scales 524 forms a specific angle "A".

Referring to FIG. 3 again, in the axis calibrating operation S20, the movement axis of the calibration board CB (for example, the first transfer rail 322 that is the movement axis of the second plate 328) may be aligned based on the location of the alignment mark "M" that is moved according to the change in the relative location of the second plate 328 and the first vision unit 530, which has been described above. According to the above-described example, the first transfer rail 322 may be rotated by a specific angle "A". The axis calibrating operation S20 may be performed directly by a user, or may be performed by a separate positioning device (not illustrated) that may rotate or move the first transfer rail 322. The positioning device may be controlled by the above-described controller 700.

In the photographing operation S30, the image of the calibration board CB may be acquired by photographing the calibration board CB by the second vision unit 540. In the photographing operation S30, the image of the calibration board CB may be acquired while the calibration board CB is moved along the first direction 12. The acquired image may be delivered to the controller 700.

In the calibration operation S40, a signal calibration value for a signal that controls the second vision unit 540 may be calculated. For example, in the calibration operation S40, the signal calibration value for the signal that controls the second vision unit 540 may be calculated.

Figure 6:
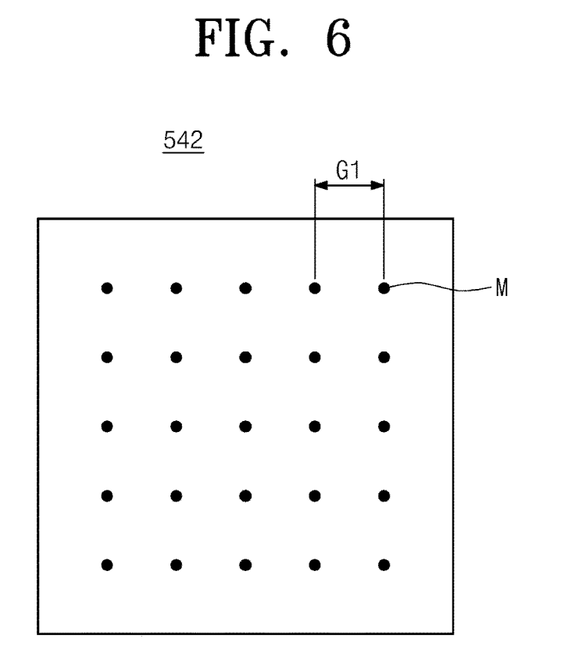
FIG. 6 is a view illustrating an image acquired by photographing the calibration board by a second vision unit in the photographing operation of FIG. 3.

For example, FIG. 6 is a view illustrating an image acquired by photographing the calibration board by a second vision unit in the photographing operation of FIG. 3. Referring to FIG. 6, the controller 700 may compare a first interval G1 that is an interval between the alignment marks "M" displayed in an image 542 captured by the second vision unit 540 and the preset interval "G" that is an actual interval of the alignment marks "M".

First, as described above, the movement axis of the calibration board CB has been calibrated via the photographing operation S10 and the axis calibrating operation S20. Accordingly, when the first interval G1 is not the same as the preset interval "G" (that is, the actual image and the acquired image are not the same), it may be seen that the second vision unit 540 has not properly acquire the actual image. For example, when a trigger signal that drives the second vision unit 540 is popped or delayed, such a problem may occur.

Figure 7:
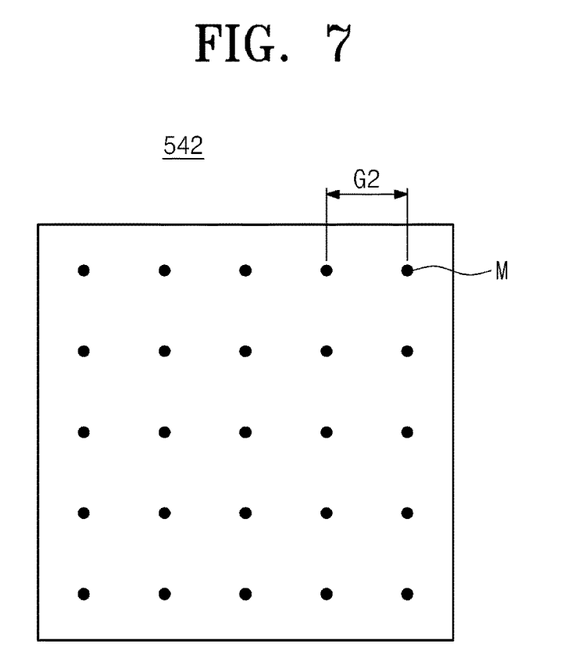
FIG. 7 is a view illustrating a state, in which the image acquired by the second vision unit is calibrated.

Accordingly, the controller 700 calculates a signal calibration value for calibrating a control signal that controls the second vision unit 540. For example, the first interval G1 that is the interval of the alignment marks "M" displayed in the image 542 captured by the second vision unit 540 and the preset interval "G" that is the actual interval of the alignment marks "M" are compared, and when the intervals are different, the signal calibration value for calibrating the control signal that controls the second vision unit 540 such that the first interval G1 may be a second interval G2 that is the same interval as the preset interval "G". In this way, when the signal that controls the second vision unit 540 is calibrated, as illustrated in FIG. 7, the preset interval "G" that is the actual interval between the alignment marks "M" of the calibration board CB and the second interval G2 that is the interval on the image 542 may be made to coincide with each other.

By using the maintenance method according to the embodiment of the inventive concept, the inkjet head 520 may be precisely maintained. Accordingly, the chemical may be precisely discharged by the inkjet head 520, and the treatment efficiency for the substrate "G" may be increased.

Furthermore, the movement axis of the substrate "G" or the calibration board CB supported by the support unit 320 to be transferred may be distorted due to a mechanical problem thereof, but the movement axis of the substrate "G" or the calibration board CB may be aligned according to the embodiment of the inventive concept, and this helps the second vision unit 540 capture an image more precisely.

Because the control signal that controls the second vision unit 540 may be calibrated by comparing the preset interval "G" that is the actual interval of the alignment marks "M" displayed on the calibration board CB and the first interval G1 that is the interval on the image included in the captured image 542, the inkjet head 520 may be maintained more certainly thereafter.

Figure 8:
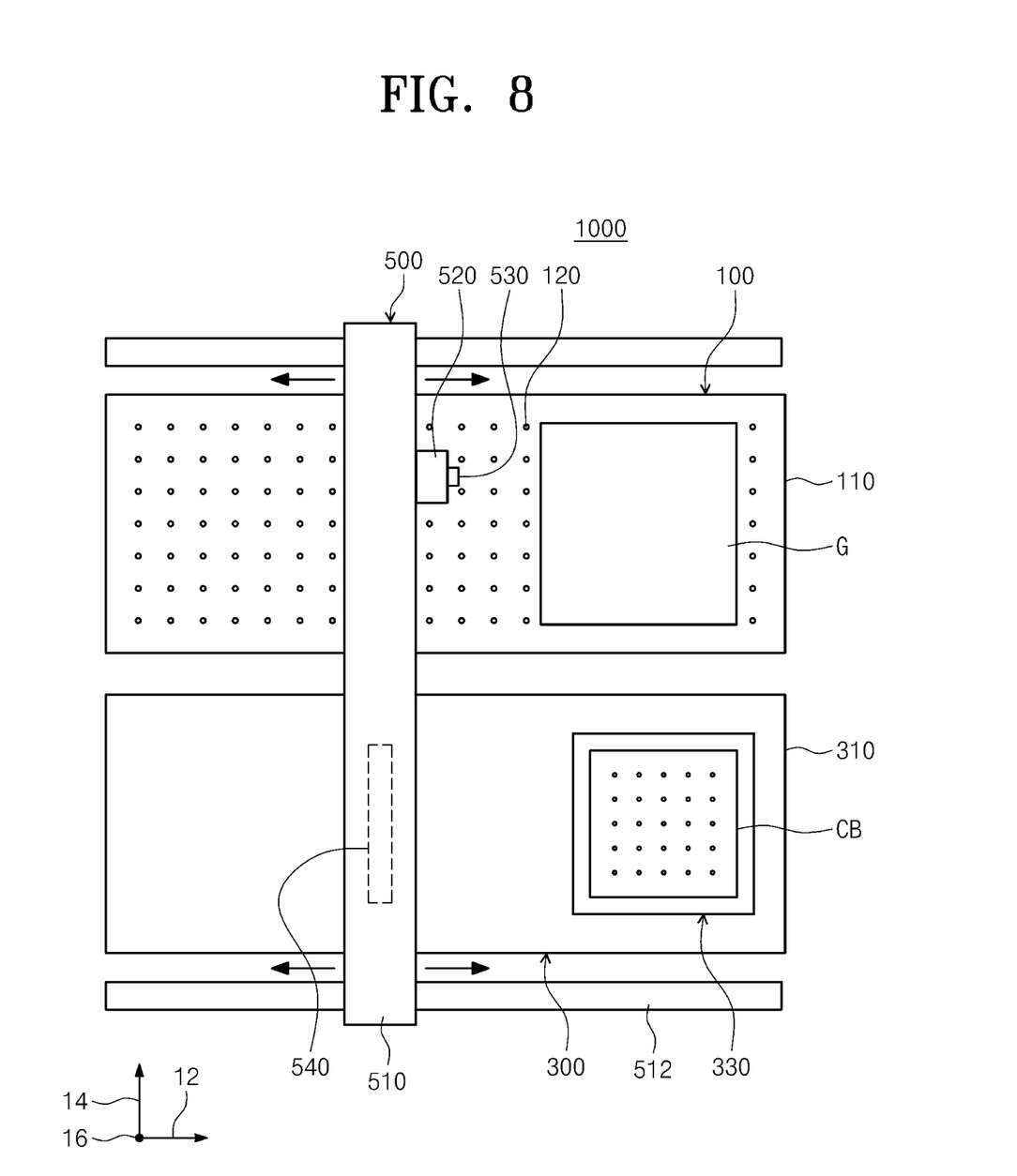
FIG. 8 is a view illustrating a substrate treating apparatus according to another embodiment of the inventive concept.

In the above-described example, it has been described as an example that the gantry 510 is fixed and the calibration board CB is moved, but the inventive concept is not limited thereto. For example, as illustrated in FIG. 8, the gantry 510 may be moved while the calibration board CB is not moved in a state in which it is seated in a support plate 330. In this case, the calibration of the axis by the first vision unit 530 may be made for a gantry rail 512 that moves the gantry 510.

Figure 9:
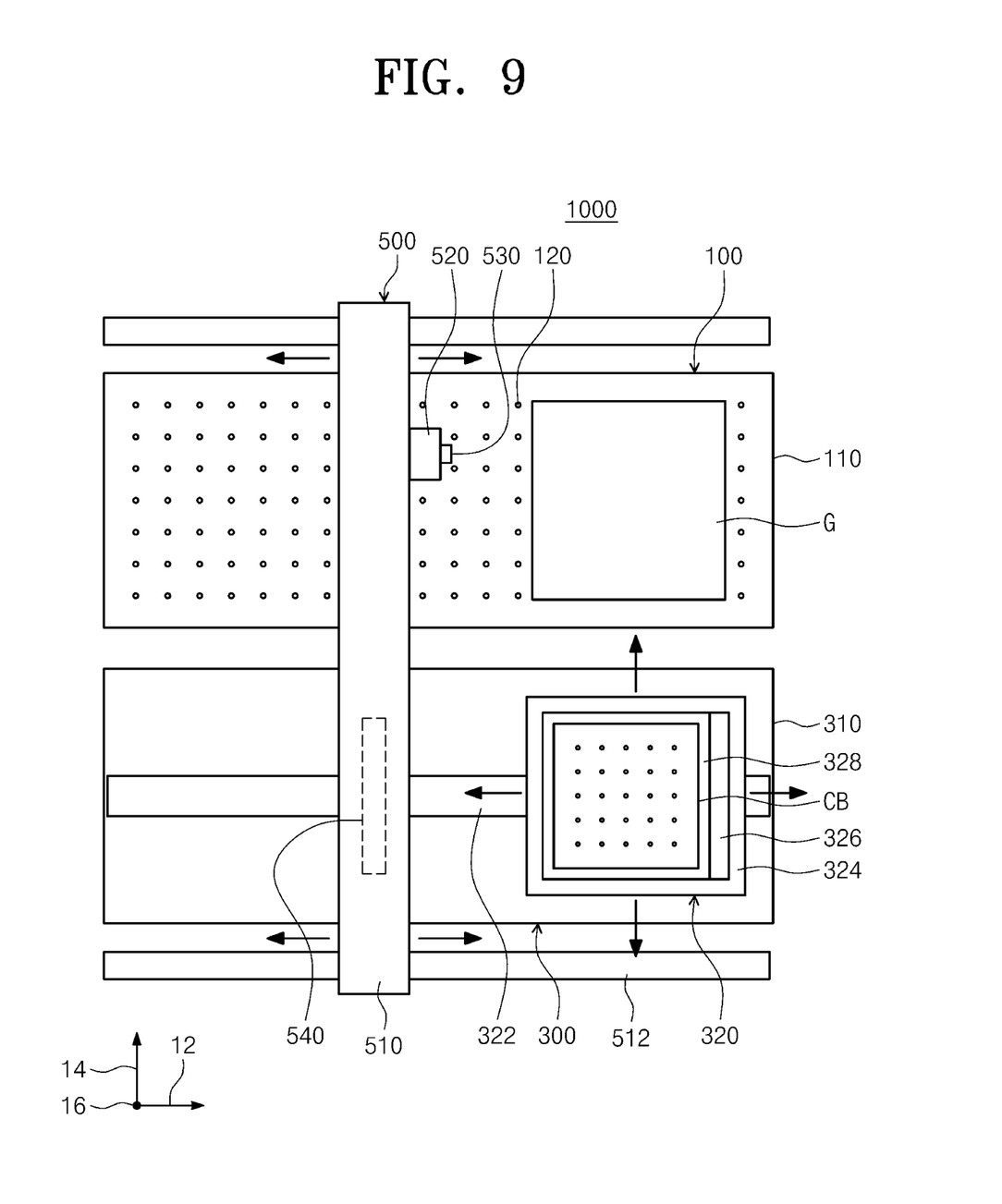
FIG. 9 is a view illustrating a substrate treating apparatus according to another embodiment of the inventive concept.

Furthermore, the above-described embodiment and another embodiment may be combined with each other to be used. For example, as illustrated in FIG. 9, the calibration board CB may be moved, and the gantry 510 may be moved. In this case, the axis calibration by the first vision unit 530 may be made for the movement axis of the calibration board CB and the movement axis of the gantry 510.

According to an embodiment of the inventive concept, the substrate may be efficiently treated.

Furthermore, According to an embodiment of the inventive concept, a discharge location (that is, a striking point) of a chemical of an inkjet head may be precisely calibrated.

Furthermore, According to an embodiment of the inventive concept, an image captured by a vision unit may be calibrated maximally similarly to an actual image.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
    a maintenance stage;
    a transfer rail extending lengthwise in a first direction and disposed at the maintenance stage;
    a process stage spaced apart from the maintenance stage in a second direction perpendicular to the first direction when viewed in a plan view, wherein a substrate to be processed is disposed on the process stage;
    a support unit configured to move along the transfer rail in the first direction and having a plate that supports a calibration board, on which a plurality of alignment marks are displayed;
    a first vision unit configured such that a relative location of the first vision unit with respect to the plate is changeable in the first direction, and configured to photograph the calibration board;
    a second vision unit configured to photograph the calibration board in a line scan scheme that is different from that of the first vision unit, wherein a length of the second vision unit is the same as or greater than a width of the calibration board so that an image of the calibration board is acquired in the line scan scheme, and wherein the length of the second vision unit and the width of the calibration board is measured in the second direction;
    a gantry disposed above the maintenance stage and the process stage, wherein the gantry extends lengthwise in the second direction, and wherein the second vision unit is fixedly attached to a bottom surface of the gantry; and
    an inkjet head movably attached to a sidewall of the gantry and configured to discharges ink toward the substrate.

2. The substrate treating apparatus of claim 1, further comprising:
    a controller configured to control the first vision unit and the support unit such that the calibration board is photographed while the relative location of the first vision unit with respect to the plate is changed.

3. The substrate treating apparatus of claim 2,
    wherein the controller is configured to:
    controls the first vision unit and the support unit such that the first vision unit captures a first image and a second image before and after the plate is moved along the transfer rail in a movement direction by an interval between two adjacent alignment marks among the plurality of alignment marks, respectively;
    compare first alignment marks of the first image with second alignment marks of the second image to determine whether the first alignment marks and the second alignment marks overlap, respectively; and
    adjust, when the first alignment marks and the second alignment marks are determined not to overlap each other respectively, a movement axis of the plate along which the plate is moved by rotating the transfer rail.

4. The substrate treating apparatus of claim 3,
    wherein the controller is configured to controls, when the first alignment marks and the second alignment marks are determined to overlap each other respectively, the second vision unit to photograph the calibration board so as to acquire the image of the calibration board.

5. The substrate treating apparatus of claim 4,
    wherein the controller is configured to compares an interval between the alignment marks included in the image and an actual interval between the alignment marks displayed on the calibration board.

6. The substrate treating apparatus of claim 5,
    wherein the controller is configured to calculates a signal calibration value for adjusting a trigger signal for driving the second vision unit by comparing the interval on the image and the actual interval.

7. The substrate treating apparatus of claim 1,
wherein the first vision unit is an area camera that photographs the calibration board in real time, and
wherein the second vision unit is a line scan camera that photographs the calibration board in the line scan scheme.

8. The substrate treating apparatus of claim 1, further comprising:
a process executing unit configured to cause a head to supply a chemical to the substrate and treat the substrate;
a maintenance unit configured to maintain the head and having the support unit; and
a liquid discharge unit having the head, and the gantry that supports the head such that the head is moved between the process executing unit and the maintenance unit.

9. The substrate treating apparatus of claim 8,
wherein, when viewed from a top, the process executing unit and the maintenance unit are disposed along the second direction, and
wherein the support unit is configured such that the plate is moved along the second direction and the first direction.

10. An inkjet printing apparatus comprising:
a maintenance stage;
a transfer rail extending lengthwise in a first direction and disposed at the maintenance stage;
a process stage spaced apart from the maintenance stage in a second direction perpendicular to the first direction when viewed in a plan view, wherein a substrate to be processed is disposed on the process stage;
a support unit configured to move along the transfer rail in the first direction and having a plate that supports a calibration board, on which a plurality of alignment marks that are spaced apart from each other by a preset interval are displayed;
a first vision unit configured such that a relative location with respect to the plate is changeable in the first direction, and configured to photograph the calibration board in real time;
a second vision unit configured to photograph the calibration board in a line scan scheme, wherein a length of the second vision unit is the same as or greater than a width of the calibration board so that an image of the calibration board is acquired in the line scan scheme, and wherein the length of the second vision unit and the width of the calibration board is measured in the second direction;
a gantry disposed above the maintenance stage and the process stage, wherein the gantry extends lengthwise in the second direction, and wherein the second vision unit is fixedly attached to a bottom surface of the gantry; and
an inkjet head movably attached to a sidewall of the gantry and configured to discharges ink toward the substrate.

11. The inkjet printing apparatus of claim 10, further comprising:
a controller,
wherein the controller controls the first vision unit and the support unit such that the calibration board is photographed while the relative location of the first vision unit with respect to the plate is changed by the preset interval.

12. The inkjet printing apparatus of claim 11, wherein, after movement axes of the plate and/or the first vision unit are aligned based on locations of the plurality of alignment marks that are moved according to a change in the relative location of the first vision unit with respect to the plate,
the controller controls the second vision unit to photograph the calibration board so as to acquire the image of the calibration board.

13. The inkjet printing apparatus of claim 12, wherein the controller compares an interval of the alignment marks included in the image and an actual interval of the alignment marks displayed on the calibration board, and calculates a signal calibration value for the second vision unit.

14. The inkjet printing apparatus of claim 10,
wherein the first vision unit is mounted on the inkjet head and is movable together with the inkjet head.

15. The inkjet printing apparatus of claim 14, further comprising:
a process executing unit having the process stage and configured to perform a printing process by causing the inkjet head to discharge the ink to the substrate; and
a maintenance unit configured to maintain the inkjet head and having the support unit,
wherein the gantry causes the inkjet head to be moved between the process executing unit and the maintenance unit.

16. An inkjet printing apparatus comprising:
a process executing unit having a process stage and configured to perform a printing process by causing an inkjet head to discharge ink to a substrate on the process stage;
a maintenance unit having a maintenance stage and a transfer rail extending lengthwise in a first direction and disposed at the maintenance stage, wherein the maintenance unit is configured to maintain the inkjet head and having a support unit having a plate that supports a calibration board, wherein the support unit is disposed at the maintenance stage, wherein the maintenance stage is spaced apart from the process stage in a second direction perpendicular to the first direction when viewed in a plan view, and wherein the calibration board has a plurality of alignment marks spaced apart from each other by a preset interval;
a liquid discharge unit having the inkjet head;
a first vision unit configured to photograph the calibration board, and being an area camera, wherein the first vision unit is configured such that a relative location with respect to the plate is changeable in the first direction;
a second vision unit configured to photograph the calibration board, and being a line scan camera, wherein a width of the second vision unit is the same as or greater than a width of the calibration board so that an image of the calibration board is acquired in a line scan scheme, and wherein the width of the second vision unit and the width of the calibration board is measured in the second direction; and
a gantry disposed above the maintenance stage and the process stage and configured such that the inkjet head is moved between the process executing unit and the maintenance unit, wherein the gantry extends lengthwise in the second direction, and wherein the second vision unit is fixedly attached to a bottom surface of the gantry,
wherein the inkjet head is movably attached to a sidewall of the gantry.

17. The inkjet printing apparatus of claim 16, further comprising:
a controller, wherein the controller controls the first vision unit and the support unit such that the calibration board is photographed in real time while a relative location of the first vision unit with respect to the plate included in the support unit and that supports the calibration board is changed.

18. The inkjet printing apparatus of claim 17,
wherein after movement axes of the plate and/or the first vision unit are aligned based on locations of the plurality of alignment marks that are moved according to a change in the relative location of the first vision unit with respect to the plate, and
wherein the controller controls the second vision unit to photograph the calibration board.

19. The inkjet printing apparatus of claim 18,
wherein the controller compares an interval of the alignment marks included in the image and an actual interval of the alignment marks of the calibration board, and calculates a signal calibration value for the second vision unit such that the interval and the actual interval coincide with each other.

* * * * *